(12) United States Patent
Chatty et al.

(10) Patent No.: US 7,005,686 B1
(45) Date of Patent: Feb. 28, 2006

(54) MIXED VOLTAGE TOLERANT ELECTROSTATIC DISCHARGE PROTECTION SILICON CONTROLLED RECTIFIER WITH ENHANCED TURN-ON TIME

(75) Inventors: Kiran V. Chatty, Williston, VT (US); Robert J. Gauthier, Jr., Hinesburg, VT (US); Mujahid Muhammad, Essex Junction, VT (US); Andreas D. Stricker, Essex Junction, VT (US); Min Woo, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/161,184

(22) Filed: Jul. 26, 2005

(51) Int. Cl.
*H01L 29/66* (2006.01)
*H01L 21/33* (2006.01)

(52) U.S. Cl. .................. 257/154; 257/155; 438/133
(58) Field of Classification Search .............. 438/133; 257/154, 155
See application file for complete search history.

(56) References Cited

U.S. PATENT DOCUMENTS

| | | | |
|---|---|---|---|
| 5,528,188 A | 6/1996 | Au et al. | |
| 5,825,600 A | 10/1998 | Watt | |
| 6,594,132 B1 | 7/2003 | Avery | |
| 6,825,530 B1 | 11/2004 | Brown et al. | |
| 2002/0079538 A1 | 6/2002 | Sue et al. | |
| 2002/0163009 A1 | 11/2002 | Ker et al. | |
| 2003/0047750 A1 | 3/2003 | Russ et al. | |
| 2003/0075726 A1 | 4/2003 | Ker et al. | |
| 2003/0076636 A1 | 4/2003 | Ker et al. | |
| 2004/0207020 A1 | 10/2004 | Chen et al. | |

OTHER PUBLICATIONS

Vargas, "Electrostatic Discharge Protection for Trench-Isolation Technologies", IBM Disclosure No. F18840168, 2 pages.

*Primary Examiner*—Evan Pert
(74) *Attorney, Agent, or Firm*—Gibb I.P. Law Firm, LLC; William D. Sabo, Esq.

(57) ABSTRACT

Disclosed is a method for increasing substrate resistance in a silicon controlled rectifier in order to decrease turn on time so that the silicon controlled rectifier may be used as an effective electrostatic discharge protection device to protect against HBM, MM and CDM discharge events. Additionally, disclosed is an improved SCR structure that is adapted for use as an electrostatic discharge device to protect against human body model events by delivering an electrostatic discharge current directly to a ground rail. The improved SCR structure incorporates various features for increasing substrate resistance and, thereby, for decreasing turn on time. These features include a second n-well that functions as an obstacle to current flow, a narrow current flow channel between co-planar buried n-bands connected to a lower portion of the second n-well, a zero threshold voltage area, and an external resistor electrically connected between the SCR and the ground rail.

20 Claims, 8 Drawing Sheets

MIXED VOLTAGE TOLERANT ELECTROSTATIC DISCHARGE PROTECTION SILICON CONTROLLED RECTIFIER WITH ENHANCED TURN-ON TIME

BACKGROUND OF THE INVENTION

1. Field of the Invention

The present invention relates to electrostatic discharge protection devices and, more particularly, to a silicon controlled rectifier with enhanced turn-on time for protecting an internal circuit from electrostatic discharge.

2. Description of the Related Art

The aggressive scaling of Complementary Metal Oxide Semiconductor (CMOS)-based technologies is resulting in transistors with smaller channel lengths, thinner gate oxides and shallower and more abrupt junctions. As a result, the semiconductor devices have smaller junction and gate oxide breakdown voltages and smaller parasitic bipolar trigger voltages. This results in increased susceptibility of the internal circuits which are comprised of these transistors to an electrostatic discharge (ESD) event.

ESD events may be generally characterized as Human Body Model (HBM), Charged Device Model (CDM) or Machine Model (MM) events. The direct transfer of electrostatic charge from a human body to a semiconductor device is often referred to as a human body model event (HBM). A discharge can also occur from a charged conductive object, such as a metallic tool or fixture; this mode is referred to as the Machine Model. Another cause of ESD is the transfer of charge from a device, for example, if a device itself becomes charged and discharges via any pin that is grounded. This is often referred to as a charged device model event (CDM). CDM pulses have a rise time in the order of hundred's of picoseconds and a pulse width of ins.

ESD protection devices such as Silicon Controlled Rectifiers (SCR's) are connected to Input/Output (I/O) pads to safely discharge the ESD current to ground without damaging internal circuits. The following are exemplary prior art references that have proposed the use of silicon controlled rectifiers (SCRs) as a means of protecting CMOS devices for ESD: U.S. Patent Application Publication No. U.S. 2002/0079538 (incorporated herein by reference); U.S. Patent Application Publication No. U.S. 2002/0163009, Ker et al, Nov. 7, 2002 (incorporated herein by reference); U.S. Patent Application Publication No. U.S. 2003/0075726, Ker et al., Apr. 24, 2003(incorporated herein by reference); and, U.S. Patent Application Publication No. U.S. 2004/0207020, Chen et al, Oct. 21, 2004 (incorporated herein by reference). While SCR's are effective ESD protection devices for HBM and MM ESD discharges, they suffer from a large turn-on time compared to grounded-gate NMOSFETs or diodes making them not so effective for very fast ESD pulses such as CDM discharges. Due to the significant advantages of SCR devices, it is essential to improve the turn-on times of the SCR to enable effective ESD protection under all types of ESD discharges. The present invention addresses the issue of faster turn-on times for silicon controlled rectifiers.

SUMMARY OF THE INVENTION

This disclosure presents a method for increasing substrate resistance in a silicon controlled rectifier in order to decrease turn on time so that the SCR may be used as an effective electrostatic discharge protection device to protect against HBM, MM and CDM discharge events. Additionally, this disclosure presents an improved SCR structure that is adapted for use as an electrostatic discharge device to protect against human body model events by delivering an electrostatic discharge current directly to a ground rail. The SCR structure incorporates various features for increasing substrate resistance leading to an improved turn-on time. Exemplary features for increasing substrate resistance include, a second n-well that functions as an obstacle to current flow, a narrow current flow channel between co-planar buried n-bands connected to the lower portion of the second n-well, a p-well implant blocked region with p-type starting wafer doping concentration (also referred to as a zero threshold voltage region), and an external resistor electrically connected between the SCR and the ground rail.

The method of the invention provides various processes by which the substrate resistance between an anode and cathode can be increased, such as by increasing the distance (e.g., horizontal or vertical distance) that the current flows in the substrate, by providing a narrow channel through which the current will flow in the substrate, by providing a zero threshold voltage area through which the current will flow in the substrate and by providing an external resistor. The distance traveled in the substrate can be increased by increasing the distance to the n-well or p-well contacts and/or by providing an obstacle (such a second n-well or isolation structure) in the substrate around which the current will flow. A channel can be formed, for example, between two co-planar buried n-bands in the substrate. If one of the n-bands extends from a lower portion of a second n-well, current will flow below the second n-well and through the channel. The more narrow the channel, the greater the resistance offered to the flow of current. As mentioned previously, a zero threshold voltage area in the substrate between the anode and cathode can be provided by blocking a p-well implant next to the n-well during the manufacturing process.

The ESD protection device of the present invention comprises a SCR for directing ESD current between an I/O pad at the anode and a ground rail at the cathode of the SCR. The SCR comprises a semiconductor substrate with a first conductivity type (e.g., a p-type substrate). The substrate has an upper surface and a lower surface. A first region with a second conductivity type (e.g., a first n+ region, also referred to as n-well contact) is located in the semiconductor substrate at the upper surface. A second region with the first conductivity type (e.g., a first p+ region, also referred to as p-emitter) is located in the semiconductor substrate also at the upper surface. The second region is electrically connected to an I/O pad. The first and second regions are located in a first well (e.g., first n-well) in semiconductor substrate at the upper surface. A third region with a second conductivity type (e.g., a second n+ region, also referred as n-emitter) is located in the semiconductor substrate at the upper surface. The third region is electrically connected to the ground rail. The third region is located in a second well with a second conductivity type (e.g., second n-well). The second well can extend beneath the third region to approximately the same depth as the first n-well. A fourth region with the first conductivity type (e.g., a second p+ region, also referred as p-well contact) is also located in the semiconductor substrate at the upper surface. The semiconductor substrate (e.g., p-type substrate) has a lower doping level than the second region (e.g., first p+ region or p-emitter) and the fourth region (e.g., second p+ region or p-well contact). Similarly, the first well (e.g., first n-well) and the second well (e.g., second n-well) have lower doping levels than the first region (e.g., first n+ region or n-well contact) and the third region (e.g., second n+ region or n-emitter). Additionally, the device can comprise a third well with a first conductivity type (e.g., a p-well) in the semiconductor substrate. The fourth region (e.g., second p+ region) and the second well (e.g., second n-well) can be located in the third well. The third well (e.g., p-well) can have a higher doping level than the semiconductor substrate and a lower doping level than the fourth region (e.g., second p+ region).

During an ESD event, the ESD current is first discharged through the p-emitter/n-well diode and then through the parasitic p-n-p transistor formed using p-emitter/n-well/p-well junctions. The injection of holes into the p-well junction results in the local potential rise of the p-well which results in the turning on of the n-emitter/p-well diode and eventually the n-emitter/p-well/n-well parasitic n-p-n transistor. The p-n-p transistor feeds holes into the p-well, while the n-p-n transistor feeds electrons into the n-well resulting in a positive feedback mechanism that eventually results in the turning on of the SCR. It is found using circuit simulations that as the resistance of the p-well increases, the time required to turn-on the SCR structure decreases. As mentioned previously, to prevent damage to internal circuits under CDM pulses, a small turn-on time is necessary. Increasing the p-well resistance (either the vertical component and/or horizontal component resistance) using process methods or using design methods will reduce the turn on time for the SCR. For example, the second well (e.g., second n-well) provides an obstacle around which current flowing from the first well (e.g., first n-well) to the fourth region (e.g., second p-type region) will travel because the current traveling in an area with a first type conductivity (e.g., a p-well) will flow around an area with a second type conductivity (e.g., around the bottom of the second n-well). Thus, the vertical distance to the fourth region (e.g., second p+ region) is increased and so is the vertical resistance.

Similarly, increasing the horizontal distance between the anode or cathode and the n-well or p-well contact can increase the horizontal substrate resistance. For example, first, second and third isolation structures, respectively, can be provided between the first region (e.g., first n+ region) and the second region (e.g., first p+ region), between the second region and the third region (e.g., second n+ region) and between the third region and the fourth region (e.g., second p+ region) such that a length of the second isolation structure is greater than a length of the first isolation structure and greater than a length of the third isolation structure. Additionally, the isolation structures may extend deeper into the substrate that the various n+ and p+ regions such that the also provide an obstacle to current flow.

Increasing the substrate resistance can also be accomplished by providing a channel through which the current will flow in order to reach the fourth region (e.g., second p+ region). For example, a channel can be created in the device and aligned below the fourth region (e.g., second p+ region). The channel can comprise a space between fifth and sixth buried co-planar regions, each with a second conductivity type (e.g., first and second buried n-bands). If the fifth region is connected to the second well (e.g., second n-well), described above, then current traveling between the first well (e.g., first n-well) and fourth region (e.g., second p+ region) will flow around the second well (e.g., second n-well), below the fifth and sixth regions (e.g., first and second n-bands) and through the space (i.e., channel, inlet, etc.). The more narrow the channel is (i.e., the closer the fifth and sixth regions), the greater the vertical resistance.

Additionally, increasing the substrate resistance can be achieved by forming a zero threshold voltage area in the substrate (e.g., p-type substrate) as opposed to a third well (e.g., p-well) because the resistance of a zero threshold voltage area is generally greater than that of a well having the same conductivity type. The zero threshold voltage area can have the same doping level as the semiconductor substrate and can be formed for example by blocking a well implant during the manufacturing process. Specifically, the well implant can be blocked to form a zero threshold voltage area adjacent the first well (e.g., first n-well) and encompassing the second well (e.g., second n-well) and the fourth region (e.g., second p+ region). Alternatively, the well implant can be partially blocked in this area such that a zero threshold voltage area is formed between the first well (e.g., first n-well) and the second well (e.g., second n-well). The fourth region (e.g., second p+ region) is thus formed in another well having a first conductivity type (e.g., another p-well) on the opposite side of the second well. Lastly, increasing the substrate resistance can be achieved by connecting an external resistor between the fourth region (e.g., second p+ region) and the ground rail.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED

Embodiments of the Invention

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 1:
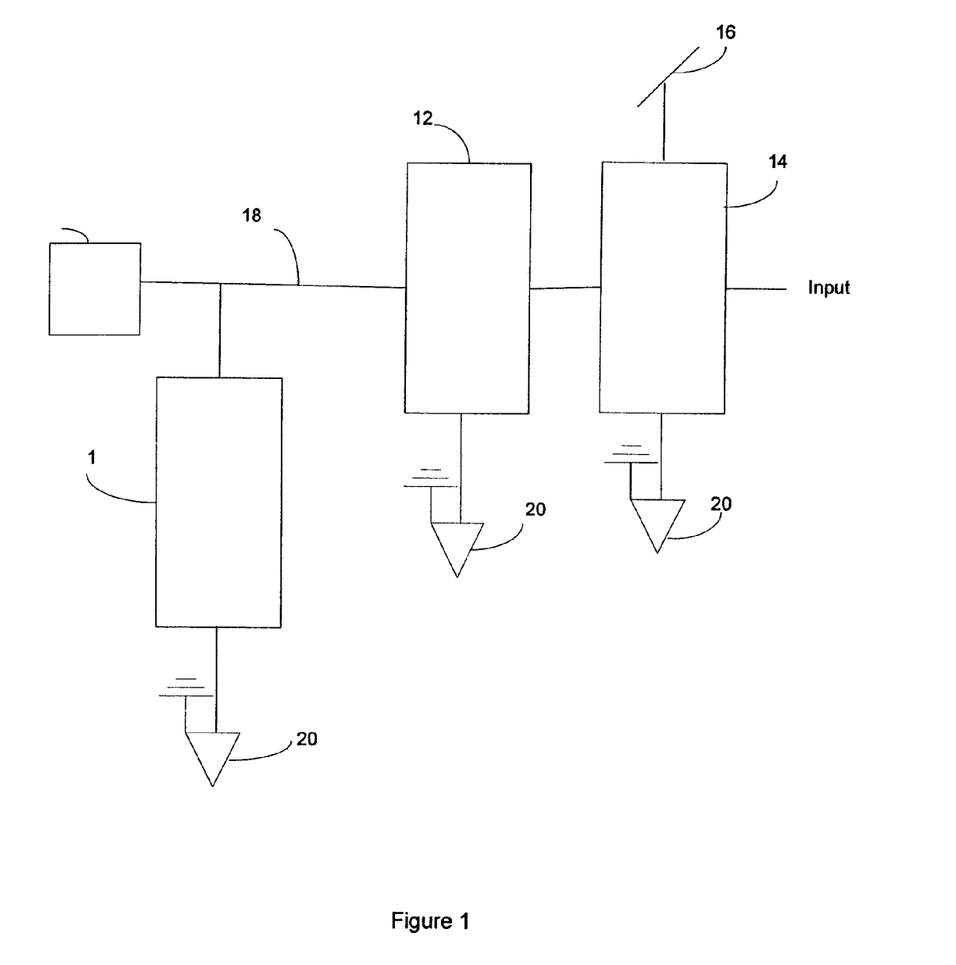
FIG. 1 is a schematic diagram of an electrostatic discharge protection device for an integrated circuit.

Referring to FIG. 1, electrostatic discharge protection devices often use silicon controlled rectifiers 1 to protect against positive mode electrostatic discharge. A silicon controlled rectifier 1 achieves ESD protection by turning on in positive mode ESD (for example., a positive mode HBM event) and directing the current from the ESD directly to a ground rail 20 from the I/O pad 10 and clamping the voltage at values that do not cause damage to internal circuits 14. Secondary ESD devices 12 are disposed between main ESD device and internal circuits for CDM protection. More particularly, ESD protection devices are often provided for the pads that interconnect a VLSI semiconductor chip with external circuits. ESD protection devices turn-on when an excessive voltage (e.g., an excessive current cause by an ESD) appears at a pad. These ESD protection devices avoid possible internal damage to the chip circuits, such as the buffer circuits at an input pad and the driver circuits at an output pad. The protection circuit for CMOS devices may involve an SCR 1.

Figure 2:
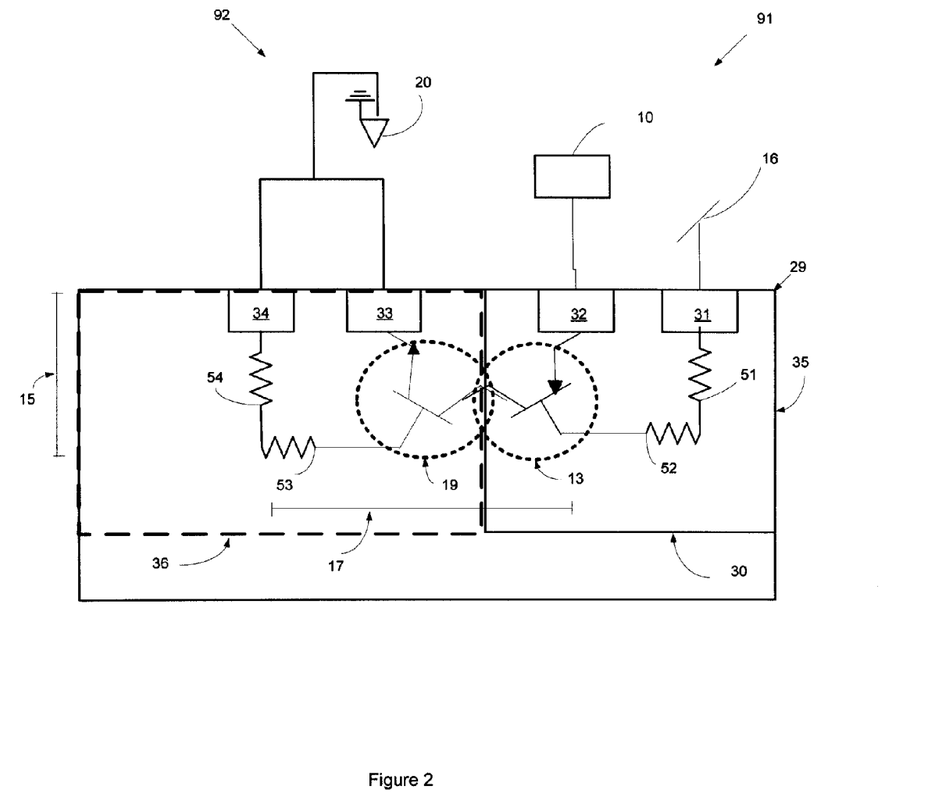
FIG. 2 is a schematic diagram of a silicon controlled rectifier.

Referring to FIG. 2, an SCR 1 is formed of a PNP bipolar transistor 13 and an NPN bipolar transistor 19 that are interconnected. The collector current of the PNP transistor 13 feeds the base current of the NPN transistor 19 and the collector current of the NPN transistor 19 feeds the base current of the PNP transistor 13 sustaining the SCR action. When either of the transistors 13, 19 is turned on, it turns on the other and both stay on allowing the current to flow from anode 91 to cathode 92 until the current is interrupted. The SCR 1 is an ideal device for on-chip protection against ESD since in its "on" state it protects sensitive devices by virtue of its comparatively low resistance. The SCRs 1 are generally formed in a p-type substrate 35. The SCR 1 comprises a PNP bipolar transistor 13 and a NPN bipolar transistor 19. The PNP transistor 13 comprises an n-well 30 in the p-type substrate 35, and an n+ region 31 and a p+ region 32 in the n-well 30. The NPN bipolar transistor 19 comprises a p-well 36 in the p-type substrate 35, and an n+ region 33 and a p+ region 34 in the p-well 36. The p+ region 32 is electrically connected to the I/O pad 10 and the n+ region 33 is electrically connected to a ground rail 20.

During a positive mode ESD event on the I/O pad 10, the PNP bipolar transistor 13 turns on first, feeding holes into the p-well 36 raising its potential. This local rise in potential results in the triggering of the NPN bipolar transistor 13, which in turn feeds electrons into the n-well 30. This feedback mechanism ultimately results in the turn on of the SCR 1 discharging current between I/O pad 10 and ground rail 20. Referring back to FIG. 1, if the SCR 1 does not turn on fast enough, voltage at the I/O pad can increase rapidly during an ESD event and the internal circuits 14 may be damaged. The standard diode triggered SCR has an approximately 8 ns turn on time, which is too slow for use as a CDM protection device. Ideally for a CDM event, the turn on time for a SCR should be less than 1–2 ns. Referring again to FIG. 2, an increase in substrate resistance (e.g., horizontal substrate resistance 53 and vertical substrate resistance 54) can decrease SCR trigger current and, thereby, decrease the SCR turn on time. For example, increasing substrate resistance from 100 Ohms to 10 kilo Ohms can reduce the turn on time from 6 ns down to 2 ns, which is acceptable for protection against HBM, MM and CDM events.

Disclosed is a SCR that is a compact with increased substrate resistance leading to an improved turn-on time and the associated methods of increasing the substrate resistance. Specifically, the SCR of the present invention provides an improved combination of features that act to provide a low turn-on voltage trigger for an SCR protecting device.

Figure 3:
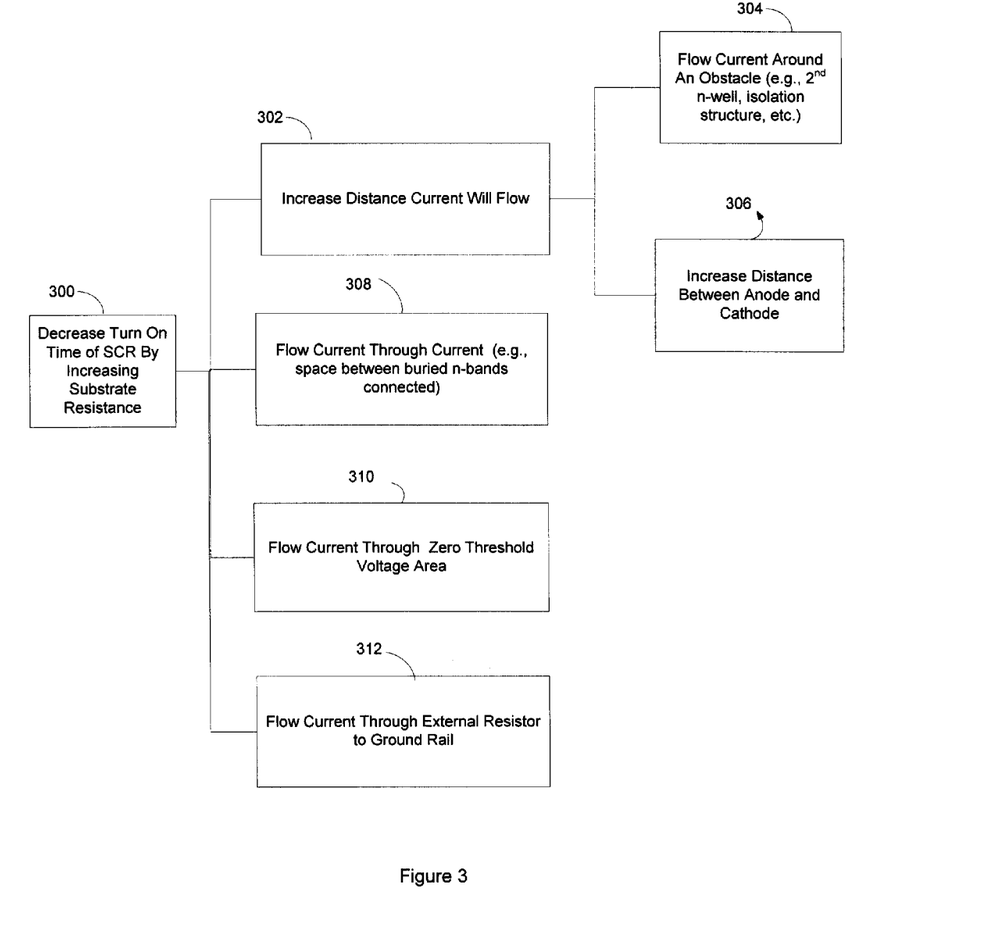
FIG. 3 is a flow diagram illustrating a method of the invention.

This disclosure presents an electrostatic discharge protection device comprising a silicon controlled rectifier with increased substrate leading to an improved turn-on time and the associated methods of reducing turn-on time of a SCR by increasing substrate resistance in a SCR. Referring to the flow diagram of FIG. 3, substrate resistance (e.g., horizontal substrate resistance 453 and vertical substrate resistance 454) between an anode 491 and cathode 492 can be increased by increasing the n+ 433 to p+ 434 spacing (302, see FIG. 4), by providing a narrow channel 773 through which the current will flow in the substrate 435 (308, see FIG. 7), by providing a zero threshold voltage area (661 of FIGS. 6 and 861 of FIG. 8) through which the current will flow in the substrate 435 (310) and by providing an external resistor 506 to the ground rail 420 (312, see FIG. 5). The n+ 433 to p+ 434 spacing (i.e., the distance traveled in the substrate 435 can be increased at process 302 by increasing the horizontal distance 417 between the anode 491 and the cathode 492 (306) and/or by increasing the vertical distance 415 to the cathode 492 by providing an obstacle (such a second n-well 437) in the substrate 435 around which the current will flow (304). Referring to FIG. 7, channel 773 can be formed at process 308, for example, between two co-planar buried n-bands 771, 772 in the substrate 435. If one of the n-bands 771 extends from a lower portion of a second n-well 437, current will flow below the second n-well 437 and two n-bands 771, 772 and through the channel 773. The more narrow the channel 773, the greater the vertical resistance 454. A zero threshold voltage area (e.g., see area 661 of FIG. 6 adjacent the first well 430 (e.g., first n-well) and encompassing the second well 437 (e.g., second n-well) and the fourth region 434 (e.g., second p+ region); see also area 861 of FIG. 8 in the substrate 435 between the first and second wells 430, 437 (e.g., between first and second n-wells)) has a greater resistance than a doped well area and can be provided at process 310 by blocking a p-well implant next to the n-well during the manufacturing process.

Figure 4:
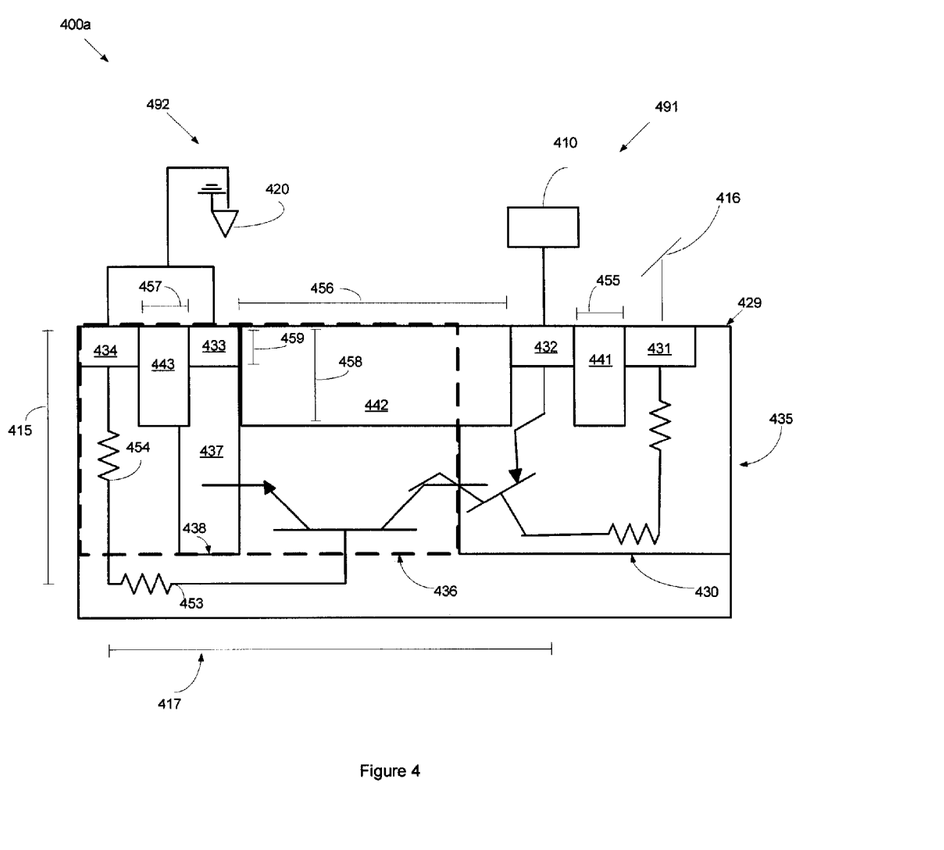
FIGS. 4–8 are schematic diagrams of embodiments of the silicon controlled rectifier of the present invention.

Referring to FIG. 4, an embodiment of the electrostatic discharge protection device of the present invention comprises a silicon controlled rectifier 400a for directing electrostatic discharge current between an input pad 410 at the anode 491 and a ground rail 420 at the cathode 492 of the SCR 400a. The silicon controlled rectifier 400a comprises a semiconductor substrate 435 with a first conductivity type (e.g., a p-type substrate). The substrate 435 has an upper surface 429 and a lower surface. A first region 431 with a second conductivity type (e.g., a first n+ region) is located in the semiconductor substrate 435 at the upper surface 429. A second region 432 with the first conductivity type (e.g., a first p+ region) is located in the semiconductor substrate 435 also at the upper surface 429. The second region 432 is electrically connected to an input pad 410. The first and second regions 431, 432 are located in a first well 430 (e.g., first n-well) in semiconductor substrate 435 at the upper surface 429. The first well 430 extends from the upper surface 429 towards the lower surface of the substrate 435 and is deeper than the first and second regions 431, 432. A third region 433 with a second conductivity type (e.g., a second n+ region) is located in the semiconductor substrate 435 at the upper surface 429. The third region 433 is electrically connected to the ground rail 420. The third region 433 is located in a second well 437 with a second conductivity type (e.g., second n-well). The second well 437 can extend beneath the third region 433 to approximately the same depth as the first n-well 430. A fourth region 434 with the first conductivity type (e.g., a second p+ region) is also located in the semiconductor substrate 435 at the upper surface 429. The semiconductor substrate 435 (e.g., p-type substrate) has a lower doping level than the second region 432 (e.g., first p+ region) and the fourth region 434 (e.g., second p+ region). Similarly, the first well 430 (e.g., first n-well) and the second well 437 (e.g., second n-well) have lower doping levels than the first region 431 (e.g., first n+ region) and the third region 433 (e.g., second n+ region). Additionally, the device 400a can comprise a third well 436 with a first conductivity type (e.g., a p-well) in the semiconductor substrate 435. The fourth region 434 (e.g., second p+ region) and the second well 437 containing the third region 433 (e.g., second n+ region in the second n-well) can be located in the third well 436. The third well 436 (e.g., p-well) can have a higher doping level than the semiconductor substrate 435 and a lower doping level than the second and fourth regions (e.g., first and second p+ regions).

Until the SCR 400a is turned on (e.g., by a trigger) a discharge current will flow between the second region 432 (e.g., first p+ region) through the first well 430 (e.g., n-well), through the third well 436 (e.g., p-well) and to the fourth region 434 (e.g., second p+ region). Once the SCR 400a is triggered on, the discharge current will flow from the second region 432 (e.g., first p+ region) to the third region 433 (e.g., second n+ region) and to ground 420. If the SCR 400a is not triggered on quickly enough, secondary ESD protection devices and internal circuits (as illustrated in FIG. 1) can be damaged. Increasing the resistance (either vertical or horizontal resistance 454, 453) in the substrate 435 will reduce the turn on time for the SCR 400a. One feature that increases turn on time by increasing resistance is the second well 437 (e.g., second n-well) which provides an obstacle to current flow. For example, an electrostatic discharge current will flow from the first well 430 (e.g., first n-well) around a lower surface 438 of the second well 437 to the fourth region 434 (e.g., second p-type region) because the current traveling in an area with a first type conductivity (e.g., a p-well) will generally flow around not through an area with a second type conductivity (e.g., around the bottom of the second n-well). Thus, the vertical distance 417 to the fourth region 434 (e.g., second p+ region) is increased and so is the vertical resistance 454.

Similarly, isolation structures 441, 442, and 443 can increase distance between the anode 491 and cathode 492 and thereby the horizontal distance 415 which a current will flow. Isolation structures 441, 442, and 443 can also provide an obstacle around which a current will flow to increase the vertical distance 417 for current flow. Thus, the isolation structures 441–443 can be used to increase vertical and horizontal substrate resistance 545, 453. For example, first 441, second 442 and third 443 isolation structures, respectively, can be provided between the first region 431 (e.g., first n+ region) and the second region 432 (e.g., first p+ region), between the second region 432 and the third region 433 (e.g., second n+ region) and between the third region 433 and the fourth 434 region (e.g., second p+ region) such that a length 456 of the second isolation structure 442 is greater than a length 455 of the first isolation structure 441 and greater than a length 457 of the third isolation structure 443. Additionally, a depth 458 of the isolation structures 441–442 can be greater than a depth 459 of the regions 431–434, thereby providing obstacles around which a current will flow.

Figure 5:
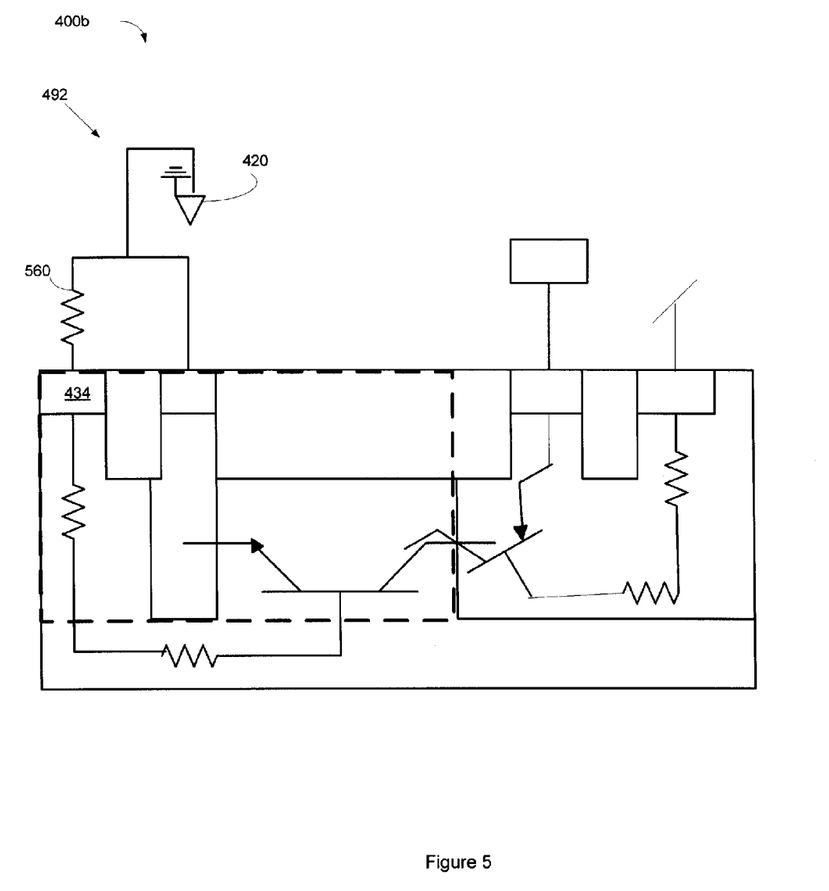

Referring to SCR 400b of FIG. 5, substrate resistance can further be increased by connecting an external resistor 560 between the fourth region 434 (e.g., second p+ region) and the ground rail 420.

Figure 6:
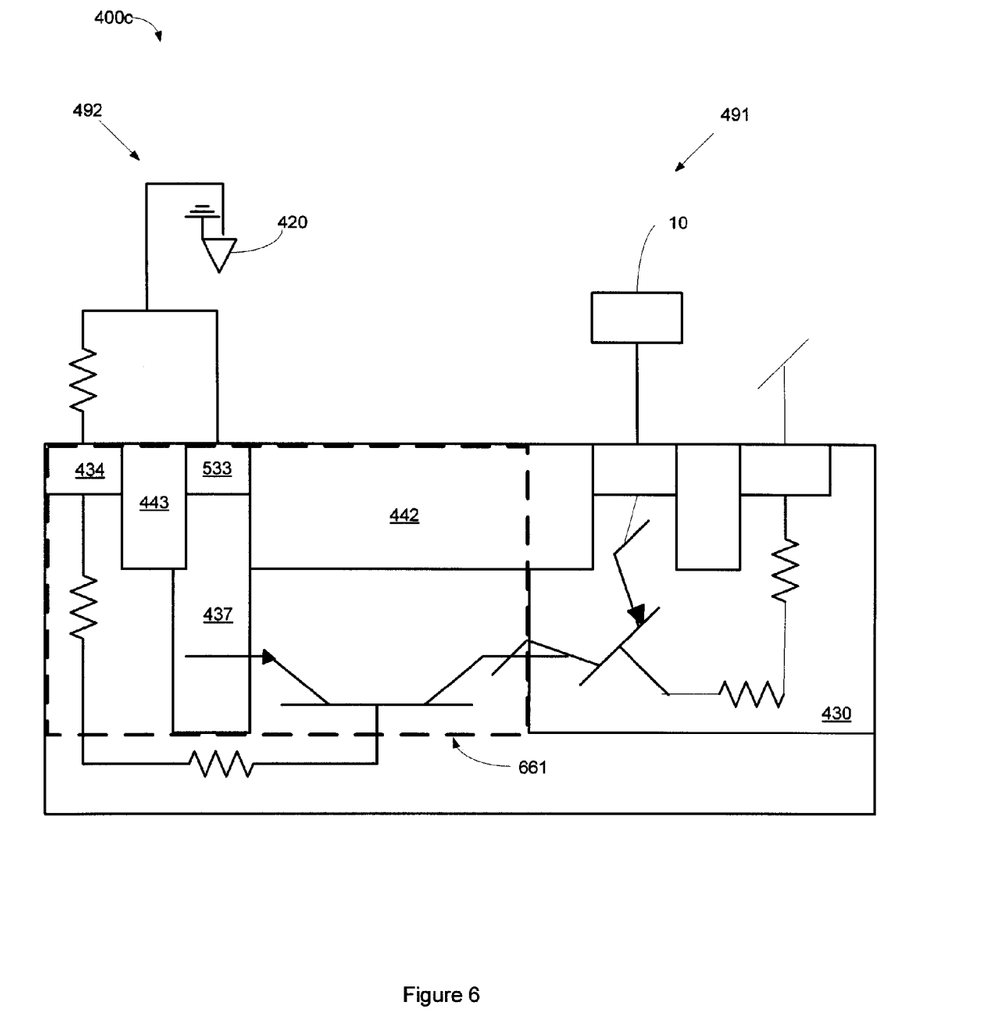
Figure 7:
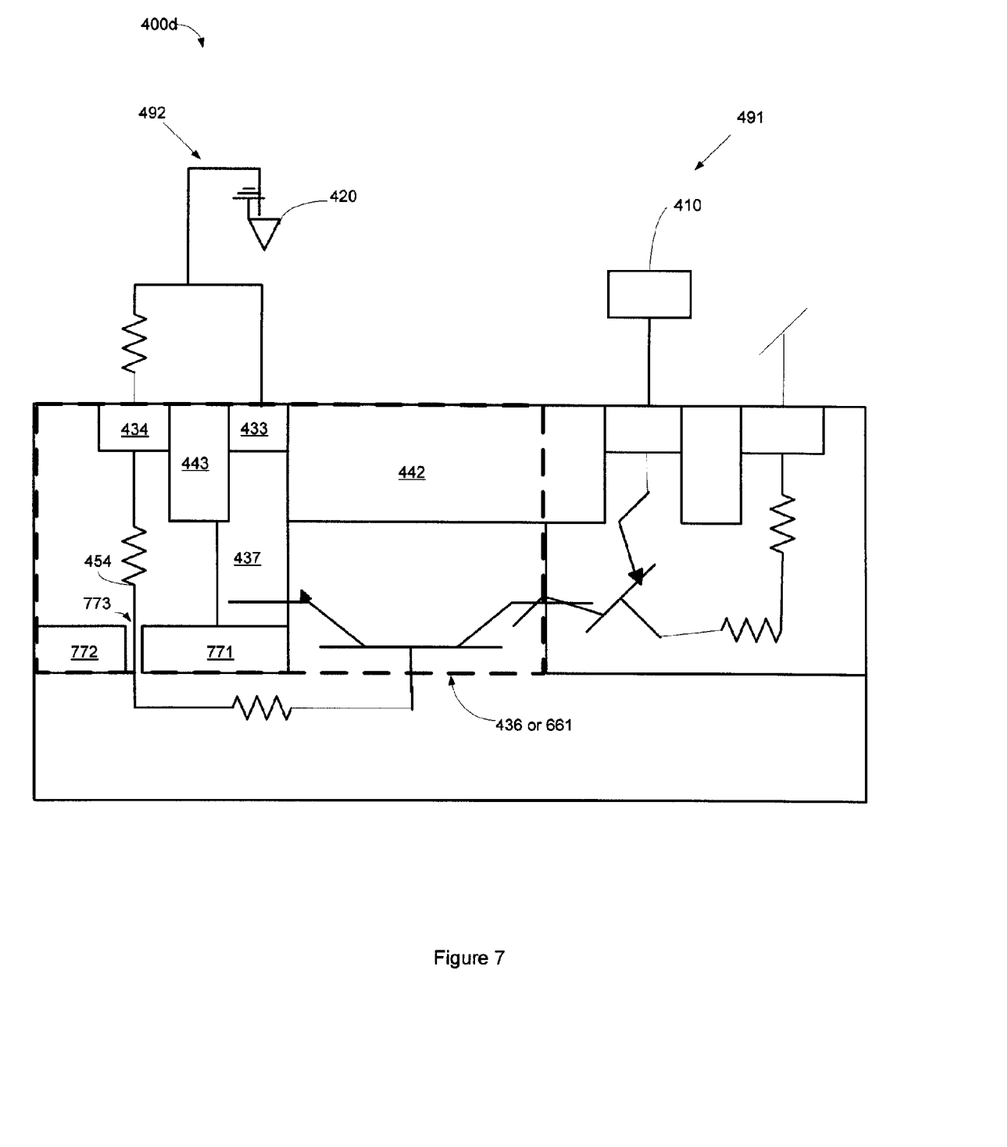

Referring to SCR 400c of FIG. 6, substrate resistance can further be increased by providing a zero threshold voltage area 661 in the substrate (e.g., p-type substrate) as opposed to a third well 436 (e.g., p-well). A zero threshold voltage area 661 is of a same conductivity type (e.g., first conductivity type) as the semiconductor substrate 435 and generally has a greater resistance than an implanted well due to the lower doping levels. The zero threshold voltage area 661 can have the same doping level as the semiconductor substrate 435 and can be formed, for example, by blocking a well implant during the manufacturing process. Specifically, the well implant can be blocked to form a zero threshold voltage area 661 adjacent the first well 430 (e.g., first n-well) and can encompass the second well 437 (e.g., second n-well) and the fourth region 434 (e.g., second p+ region).

Referring to SCR 400d of FIG. 7, substrate resistance can further be increased by providing a channel 773 through which the current will flow in order to reach the fourth region 434 (e.g., second p+ region). For example, a channel 773 can be created in the device 400d and aligned below the fourth region 434 (e.g., second p+ region). The channel 773 can comprise a first conductivity type (p-type) space between a buried fifth region 771 and a buried sixth region 772. The buried fifth region can have a second conductivity type (e.g., a first buried n-band) can be aligned below the third region 433 and connected to a lower portion of the second well 437 (e.g., second n-well) to form an L-shape. The buried sixth region 772 with a second conductivity type (e.g., a second buried n-band) is co-planar with the buried fifth region 771 such that a space between the two regions 771–772 forms channel 773. Current traveling between the first well 430 (e.g., first n-well) and fourth region 434 (e.g., second p+ region) will flow down around the second well 437 (e.g., second n-well) and below the fifth and sixth regions 771–772 (e.g., first and second n-bands) and through the space (i.e., channel 773, inlet, etc.). The more narrow the channel 773 is (i.e., the closer the fifth and sixth regions 771–772), the greater the vertical resistance 454 because of the reduced area through which the current can flow. As discussed above, with regard to structures 400c and 400a, the area adjacent the first well 430 (e.g., first n-well) and encompassing the second well 437 and the fourth 434, fifth 771 and sixth 772 regions, including the channel 773, encompassed in a third well 436 with a second conductivity type (e.g., a p-well) or the well implant can blocked such that these regions 434, 771, and 772 are located in a zero threshold voltage area 661.

Figure 8:
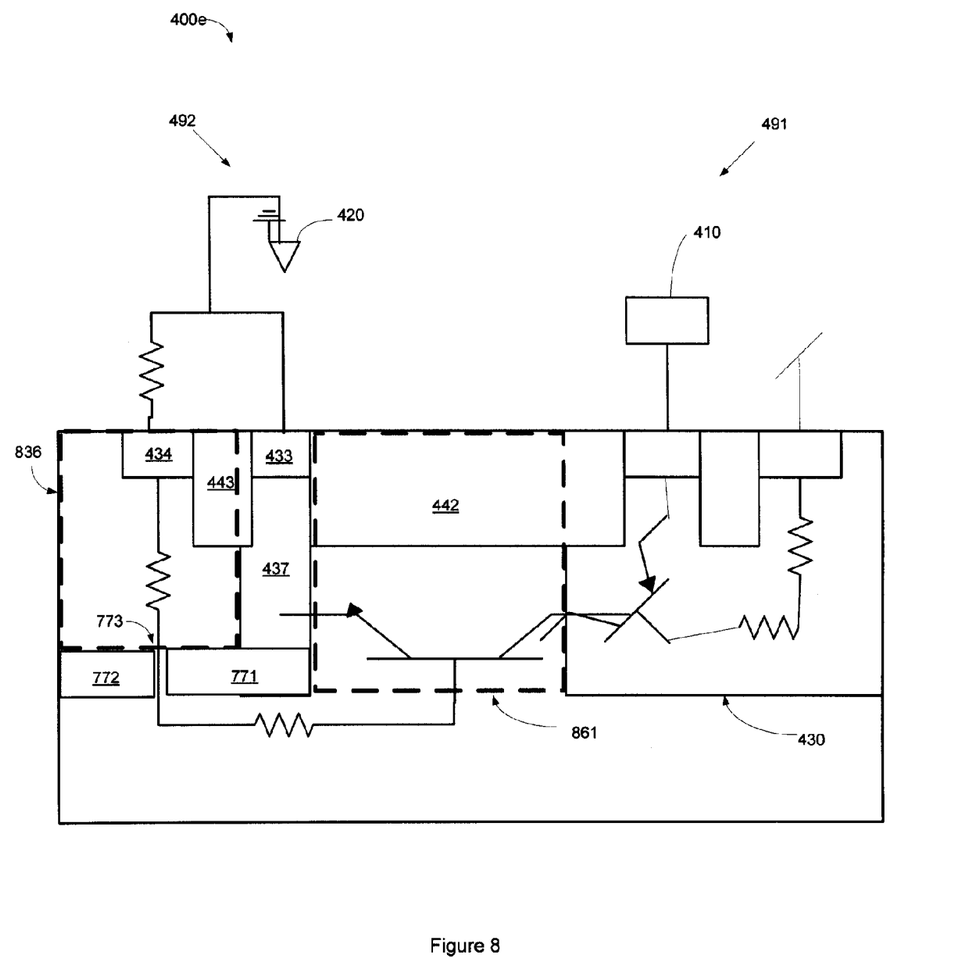

Alternatively, referring to FIG. 8, the third well 436 implant can be partially blocked in this area so that the resulting structure 400e comprises a zero threshold voltage area 861 between the first well 430 (e.g., first n-well) and the second well 437 (e.g., second n-well) below the second isolation structure 442 in order to increase substrate resistance, as described above. The structure 400e also comprises another well 836 that is smaller than the first well 430 and has a first conductivity type (e.g., a p-well). The other well 836 is located on the opposite side of the second well 437 between the upper surface 429 of the substrate 435 and fifth and sixth regions 771, 772 and encompasses the fourth region 434 (e.g., second p+ region).

Therefore, disclosed above is a method for increasing substrate resistance in a silicon controlled rectifier in order to decrease turn on time so that the silicon controlled rectifier may be used as an effective electrostatic discharge protection device to protect against human body model events. Additionally, disclosed is an improved SCR structure that is adapted for use as a protective device against electrostatic discharges like human body model, machine model, or charged device model events by delivering the electrostatic discharge current directly to a ground rail. The SCR structure incorporates various features for increasing substrate resistance and, thereby, for decreasing turn on time. Exemplary features for increasing substrate resistance include, a second n-well that functions as an obstacle to current flow, a narrow current flow channel between co-planar buried n-bands connected to the lower portion of the second n-well, a zero threshold voltage area, and an external resistor electrically connected between the SCR and the ground rail. While the invention has been described in terms of embodiments, those skilled in the art will recognize that the invention can be practiced with modification within the spirit and scope of the appended claims.

What is claimed is:

1. A silicon controlled rectifier for directing electrostatic discharge current between an input pad and a ground rail, said rectifier comprising:
   a semiconductor substrate with a first conductivity type and having an upper surface;
   a first region in said semiconductor substrate at said upper surface, wherein said first region has a second conductivity type;
   a second region in said semiconductor substrate at said upper surface, wherein said second region has said first conductivity type and is electrically connected to said input pad;
   a third region in said semiconductor substrate at said upper surface, wherein said third region has said second conductivity type and is electrically connected to said ground rail;
   a fourth region in said semiconductor substrate at said upper surface, wherein said fourth region has said first conductivity type;
   a first well in said semiconductor substrate at said upper surface, wherein said first well has said second conductivity type and wherein said first region and said second region are in said first well; and,
   a second well in said semiconductor substrate at said upper surface, wherein said third region is in said second well, wherein said second well extends to a same depth as said first well, wherein said second well has said second conductivity type and wherein said discharge current flows from said first well around a lower surface of said second well to said fourth region prior to said rectifier turning on.

2. The rectifier of claim 1, wherein said semiconductor substrate has a lower doping level than said second region and said fourth region, and wherein said first well and said second well have lower doping levels than said first region and said third region.

3. The rectifier of claim 1, wherein said fourth region is electrically connected to said ground rail and wherein said device further comprises a resistor electrically connected between said fourth region and said ground rail.

4. The rectifier of claim 1, further comprising a zero threshold voltage area in said semiconductor substrate, wherein said third region, said second well and said fourth region are in said zero threshold voltage area.

5. The rectifier of claim 1, further comprising:
   a first isolation structure between said first region and said second region;
   a second isolation structure between said second region and said third region; and,
   a third isolation structure between said third region and said fourth region;
   wherein a length of said second isolation structure is greater than a length of said first isolation structure and greater than a length of said third isolation structure.

6. The rectifier of claim 1, further comprising:
   a fifth region with a second conductivity type buried below said third region and in contact with a lower portion of said second well; and,
   a sixth region with a second conductivity type co-planar with said fifth region,
   wherein a space between said fifth region and said sixth region is aligned below said fourth region.

7. The rectifier of claim 6, further comprising another well in said semiconductor substrate at said upper surface and extending to said fifth region and said sixth region and a zero threshold voltage area in said semiconductor substrate between said first well and said second well,
   wherein said fourth region is in said other well, and
   wherein said other well has said first conductivity type, a higher doping level than said semiconductor substrate and a lower doping level than said fourth region.

8. The rectifier of claim 1 further comprising a third well in said semiconductor substrate at said upper surface,
   wherein said third well has said first conductivity type,
   wherein said fourth region and said second well are in said third well, and
   wherein said third well has a higher doping level than said semiconductor substrate and a lower doping level than said fourth region.

9. A silicon controlled rectifier for directing electrostatic discharge current between an input pad and a ground rail, said rectifier comprising:
   a p-type semiconductor substrate having an upper surface;
   a first n-type region in said semiconductor substrate at said upper surface;
   a first p-type region in said semiconductor substrate at said upper surface and electrically connect to said input pad;
   a second n-type region in said semiconductor substrate at said upper surface and electrically connected to said ground rail;
   a second p-type region in said semiconductor substrate at said upper surface
   a first n-well in said semiconductor substrate at said upper surface, wherein said first n-type region and said first p-type region are in said first n-well; and,
   a second n-well in said semiconductor substrate at said upper surface, wherein said second n-type region is in said second n-well, wherein said second n-well extends to a same depth as said first n-well, and wherein said discharge current flows from said first n-well around a lower surface of said second n-well to said second p-type region prior to said rectifier turning on.

10. The rectifier of claim 9, wherein said p-type semiconductor substrate has a lower doping level than said first p-type region and said second p-type region, and wherein said first n-well and said second n-well have lower doping levels than said first n-type region and said second n-type region.

11. The rectifier of claim 9, wherein said second p-type region is electrically connected to said ground rail and wherein said device further comprises a resistor electrically connected between said second p-type region and said ground rail.

12. The rectifier of claim 9, further comprising a zero threshold voltage area in said semiconductor substrate, wherein said second n-type region, said second n-well and said second p-type region are in said zero threshold voltage area.

13. The rectifier of claim 9, further comprising:
a first isolation structure between said first n-type region and said first p-type region;
a second isolation structure between said first p-type region and said second n-type region; and,
a third isolation structure between said second n-type region and said second p-type region,
wherein a length of said second isolation structure is greater than a length of said first isolation structure and greater than a length of said third isolation structure.

14. The rectifier of claim 9, further comprising:
a third n-type region buried below said second n-type region and in contact with a lower portion of said second n-well; and,
a fourth n-type region co-planar with said third n-type region, wherein a space between said third n-type region and said fourth n-type region is aligned below said second p-type region.

15. The rectifier of claim 14, further comprising:
a p-well in said semiconductor substrate at said upper surface and extending to said third n-type region and said fourth n-type region; and,
a zero threshold voltage area in said semiconductor substrate between said first n-well and said second n-well,
wherein said second p-type region is in said p-well, and
wherein said p-well has a higher doping level than said semiconductor substrate and a lower doping level than said second p-type region.

16. The rectifier of claim 9, further comprising a p-well in said semiconductor substrate at said upper surface, wherein said second p-type region and said second n-well are in said p-well, and wherein said p-well has a higher doping level than said semiconductor substrate and a lower doping level than said second p-type region.

17. A method of enhancing a turn-on time of a silicon controlled rectifier, said method comprising:
providing a silicon controlled rectifier in a semiconductor substrate to deliver an electrostatic discharge current between an input pad and a ground rail; and
increasing resistance in said semiconductor substrate to a flow of said electrostatic discharge current by flowing said current around an obstacle in said substrate;
wherein a turn on time of said silicon controlled rectifier in response to said electrostatic discharge current is a function of said resistance.

18. The method of claim 17,
wherein said semiconductor substrate has a first conductivity type,
wherein said flowing of said electrostatic discharge current around an obstacle in said semiconductor substrate comprises flowing said electrostatic discharge current around a well with a second conductivity type in said semiconductor substrate, and
wherein said second type conductivity is different than said first conductivity type.

19. The method of claim 17, wherein said increasing of said resistance further comprises flowing said electrostatic discharge current through a channel in said semiconductor substrate.

20. The method of claim 17, wherein said increasing of said resistance further comprises flowing said electrostatic discharge current through a zero threshold voltage area in said semiconductor substrate.

* * * * *